United States Patent [19]

Saaski et al.

[11] Patent Number: 5,021,731
[45] Date of Patent: Jun. 4, 1991

[54] THERMO-OPTICAL CURRENT SENSOR AND THERMO-OPTICAL CURRENT SENSING SYSTEMS

[75] Inventors: Elric W. Saaski, Bothell; Dale M. Lawrence, Lynnwood, both of Wash.

[73] Assignee: Metricor, Inc., Woodinville, Wash.

[21] Appl. No.: 313,631

[22] Filed: Feb. 21, 1989

[51] Int. Cl.$^5$ .................. G01R 5/22; G01K 11/12
[52] U.S. Cl. .................. 324/96; 324/106; 374/161
[58] Field of Search .................. 324/96, 106; 374/161, 374/162; 350/356

[56] References Cited

U.S. PATENT DOCUMENTS

| | | |
|---|---|---|
| Re. 31,879 | 5/1985 | Lubbers et al. |
| 2,806,023 | 9/1957 | Wenker. |
| 3,202,652 | 8/1965 | Meininger et al. |
| 3,273,447 | 9/1966 | Wallace. |
| 3,446,565 | 9/1969 | Rigod. |
| 3,627,408 | 12/1971 | Fergason .................. 324/96 |
| 3,705,310 | 12/1972 | Wild .................. 324/96 |
| 4,006,414 | 2/1977 | Parker .................. 324/96 |
| 4,016,761 | 4/1977 | Rozzell et al. |
| 4,029,597 | 6/1977 | Neisius et al. |
| 4,051,435 | 9/1977 | Fanslow. |
| 4,118,485 | 10/1978 | Eriksson et al. |
| 4,140,393 | 2/1979 | Cetas. |
| 4,210,029 | 7/1980 | Porter. |
| 4,249,076 | 2/1981 | Bergstrom et al. |
| 4,275,296 | 6/1981 | Adolfsson. |
| 4,307,607 | 12/1981 | Saaski et al. |
| 4,316,388 | 2/1982 | Miller et al. |
| 4,329,058 | 5/1982 | James. |
| 4,356,396 | 10/1982 | Ruel et al. |
| 4,367,040 | 1/1983 | Goto. |
| 4,428,239 | 1/1984 | Johnston. |
| 4,437,761 | 3/1984 | Kroger et al. |
| 4,446,366 | 5/1984 | Brohardh et al. |
| 4,487,206 | 12/1984 | Aagard. |
| 4,498,004 | 2/1985 | Adolfsson et al. |
| 4,540,293 | 9/1985 | Shores. |
| 4,613,811 | 9/1986 | Vaerewyck et al. .................. 324/96 |
| 4,617,608 | 10/1986 | Blonder et al. |
| 4,678,904 | 7/1987 | Saaski et al. |
| 4,682,500 | 7/1987 | Kuzutaka et al. |

FOREIGN PATENT DOCUMENTS 208520 11/1982 Japan.
58-62572(A) 6/1983 Japan.

OTHER PUBLICATIONS

Silacon as a Mechanical Material, Proceeding of the IEEE, vol. 70, No. 5, May, 1982, by Kurt Peterson, pp. 420-442.
Field Assisted Glass Sealing, Electrocomponent Science & Technology, 1975, vol. 2, No. 1, pp. 45-53 by George Wallis.
IEEE International Microwave Symposium Symposium, 1975: Microwaves in Service to Man, Palo Alto, May 12-14, 1975, IEEE (Piscataway, U.S.), O. P. Candai et al.: *A Nonperturbing Liquid Crystal Fiberoptic Microwave Power Probe*, pp. 297-298.
IEEE International Symposium, 1987, on Electromagnetic Compatibility, Atlanta, GA, Aug. 25-27 1987, K. R. Lee et al.: *Improved Measurement Techniques of Bridgewire Caused by Induced Electromagnetic Radiation*, pp. 32-35.
Instruments and Experimental Techniques, vol. 14, No. 3II, May/Jun., 1971, Plenum Publishing Corp., (New York, U.S.), L. V. Kutukov et al.: *Use of Phosphors to Investigate the Thermal Modes of Radio-Electronic Circuits*, pp. 826-827.

Primary Examiner—Ernest F. Karlsen
Attorney, Agent, or Firm—Seed and Berry

[57] ABSTRACT

A thermo-optical current sensor includes a resistive or semiconducting sensing element that has an optical property that varies as a function of temperature. Current to be measured flows through the sensing element thereby causing heating that is detected by a change in the optical property. The sensing element may be either a resistive or semiconducting material having a temperature dependent optical property or a resistive or semiconducting material that is in thermal contact with an optical temperature sensor. The thermo-optical current sensor may be used as a field meter to measure the intensity of an electromagnetic field or as a current meter to measure the current flowing through a power line.

23 Claims, 5 Drawing Sheets

THERMO-OPTICAL CURRENT SENSOR AND THERMO-OPTICAL CURRENT SENSING SYSTEMS

DESCRIPTION

1. Technical Field

This invention relates to current sensors and, more particularly, to a current sensor that optically measures the temperature of a resistive element that is heated by the measured current, and to various systems utilizing the current sensor.

2. Background Art

Current sensors are commonly used in a broad spectrum of applications. Conventional current sensors are based on a variety of scientific and other principles. A common technique is to pass the measured current through a resistor and then measure the current induced voltage across the resistor. Another technique is to measure the magnetic field generated as a current passes through a conductor.

Current sensors employing the above techniques, as well as most other current sensors, utilize electronic devices generating voltages that are indicative of the measured current. While these current sensors are suitable for most purposes, there are some applications in which such sensors cannot be used. Conventional current sensors often cannot be used in the presence of highly intense electromagnetic fields, such as encountered during an electromagnetic pulse (EMP) or near high power radar transmissions. For example, radar energy levels as high as 1–10 w/cm$^2$ can be found on the decks of modern aircraft carriers. Aircraft on the decks of these carriers usually carry missiles that contain electro-explosive devices (EED's) to disengage the missiles from the aircraft. These EED's typically use detonators that are fired by applying a current to the EED through a pair of wires. The high electromagnetic levels present on the decks of carriers can induce sufficient current in the detonator wires leading to the EED to inadvertently activate the EED. It would be desirable to measure the electromagnetic induced current in the detonator wires either to perform tests to determine if there is a potential problem on a carrier deck or to warn the pilot of or prevent an inadvertent firing of the EED as a result of current induced on the detonator wires by ambient electromagnetic radiation. However, the high intensity electromagnetic radiation that induces current in the detonator wires can interfere with the operation of conventional current sensors, thus preventing the measurement of electromagnetically induced currents in the detonator wires.

Another situation in which conventional current sensors using electronic devices sometimes cannot be used is in the measurement of currents induced in antennas by electromagnetic fields. Conventional current sensors employing electronic devices may also be unsuitable for use in the presence of nuclear radiation.

DISCLOSURE OF THE INVENTION

It is an object of the invention to provide a current sensor that can be used in the presence of strong electromagnetic fields and nuclear radiation.

It is another object of the invention to provide a current sensor that operates over a relatively broad band of frequencies.

It is still another object of the invention to provide a current sensor that can be easily adapted to measure a wide variety of current ranges.

These and other objects of the invention are provided by a thermo-optical current sensor for measuring the current flowing between a pair of conductors. The sensor includes an optical-sensing element having a resistive or semiconducting electrical property and an optical property that is a function of the temperature of the sensing element. The conductors through which the current to be measured flows are connected between spaced apart locations on the sensing element. As a result, the temperature of the optical-sensing element varies as a function of the current through the conductors and the temperature dependant optical property of the sensing element varies accordingly. An optical fiber extends from the optical-sensing element for monitoring the temperature dependent optical property of the optical-sensing element. The optical-sensing element may be a single layer of material having both a resistive or semiconducting electrical property and an optical property that is a function of the temperature of the sensing element. Alternatively, the optical-sensing element may be an optical temperature sensor having an optical property that is a function of the temperature of the temperature sensor and a resistive or semiconducting element mounted on and in thermal contact with the temperature sensor. In the event that a separate optical temperature sensor is used, it may be an optical resonator using a resonance supporting material or a cavity filled with a sensing material. One or more optical properties of the resonant material or cavity material is then altered as a function of the temperature of the resonant material or cavity material. The resonant material or cavity material may have either an index of refraction, optical thickness or absorbance that varies as a function of temperature. The temperature sensor may also be a sharp-cut filter glass temperature sensor having a temperature dependent spectral absorption edge or an organic dye having a temperature dependent color. The current sensor may be used to measure spurious signals induced by electromagnetic fields in actuating lines for detonators in order to prevent or provide a warning of inadvertent actuation. The current sensor may also be used to measure the intensity of electromagnetic fields and to measure the current flowing through power lines.

BEST MODE FOR CARRYING OUT THE INVENTION

Figure 1:
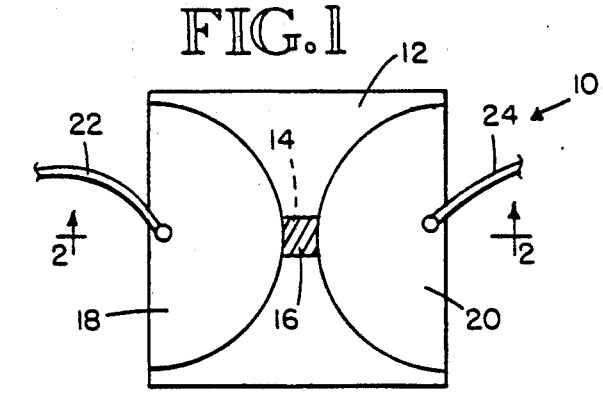
FIG. 1 is top plan view of one embodiment of the inventive thermo-optical current sensor.
Figure 2:
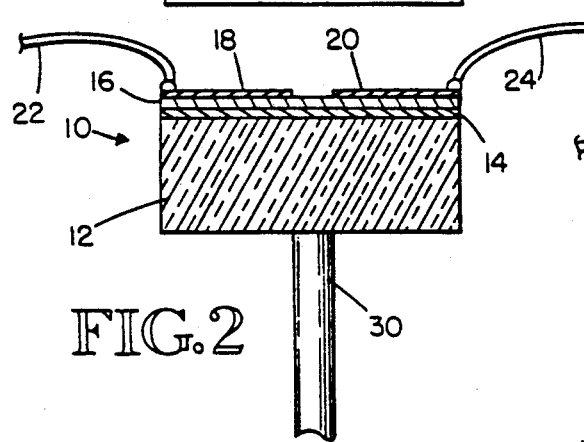
FIG. 2 is a cross-sectional view of the thermo-optical current sensor of FIG. 1 taken along the line 2—2 of FIG. 1.

One embodiment of the inventive thermo-optical current sensors 10 is illustrated in FIGS. 1 and 2. The sensor 10 includes a transparent substrate 12 on which a temperature-sensing element 14 is mounted. A layer of resistive or semiconductive element 16 is placed on top of the optical temperature-sensing element 14, and a pair of spaced apart-conducting bonding pads 18, 20 overlie the resistive element 16. A pair of conductors 22, 24 are attached to the upper surfaces of the bonding pads 18, 20, respectively, by conventional means, such as by welding.

The current to be measured is applied to the sensor 10 through the conductors 22, 24. The current flows from conductor 22 to bonding pad 18, through the resistive or semiconductive element 16 and then through the bonding pad 20 and conductor 24. The current flowing through the resistive or semiconducting element 16 produces a rise in temperature of the resistive or semiconducting element 16. This rise in temperature is coupled to the optical temperature-sensing element 14 thereby changing an optical property of the temperature-sensing element 14. The change in the temperature-sensing material's optical property is detected by suitable means, such as through a conventional optical fiber 30 abutting the underside of the transparent substrate 12.

As best illustrated in FIG. 1, the resistive or semiconductive element 16 has a reduced cross-sectional area between the bonding pads 18, 20. As a result, the heat generated by the element 16 is concentrated in a relatively small area. Consequently, the heating of the optical temperature-sensing element 14 is also confined to a relatively small area that is directly above the interrogating optical fiber 30. In practice, it is preferable to limit the heating effect to an approximate square, circular or other limited area having about 1 to 250 microns characteristic dimension.

The rise in temperature of the resistive or semiconducting element 16 is approximately equal to $q/(qaK)$ where q is the heat dissipated in the resistive or semiconducting element 16, a is the radius of the generally cylindrical area of the element 16, 16' and K is the thermal conductivity of the substrate 12. As a design illustration, for a heat input of 1 milliwatt over a 50 micron radius spot and a Corning 7740 glass substrate (in which $K=0.01w/cmK$), the temperature rise is 10 degrees C.

Figure 3:
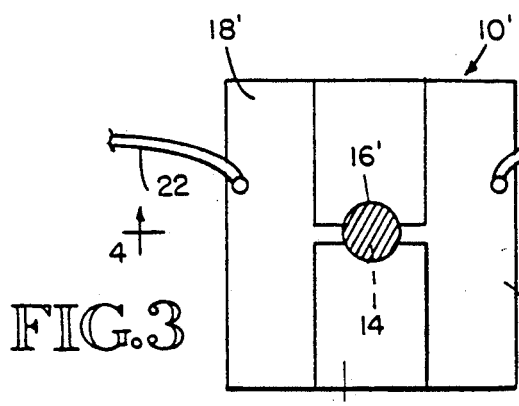
FIG. 3 is top plan view of another embodiment of the inventive thermo-optical current sensor.
Figure 4:
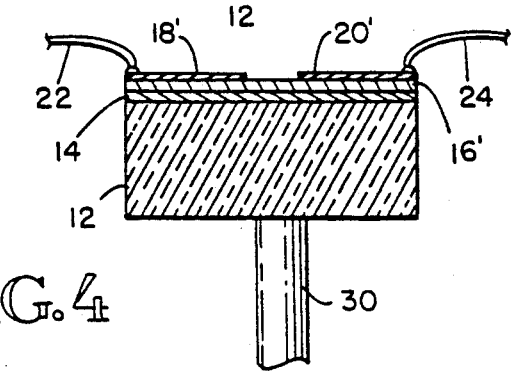
FIG. 4 is a cross-sectional view of the thermo-optical current sensor of FIG. 3 taken along the line 4—4 of FIG. 3.

An alternative embodiment of a thermo-optical current sensor 10' is illustrated in FIGS. 3 and 4. The current sensor 10' of FIGS. 3 and 4 is very similar to the current sensor 10 of FIGS. 1 and 2. Therefore, in the interest of brevity, the components of the sensor 10' of FIGS. 3 and 4 that are identical to components in the sensor 10 of FIGS. 1 and 2 have been given identical reference numerals. The current sensor 10' of FIGS. 3 and 4 differs from the current sensor 10 of FIGS. 1 and 2 solely in the geometry of the resistive or semiconducting element 16' and the geometry of the bonding pads 18', 20'. In the embodiment of FIGS. 3 and 4, the current sensor 10' utilizes a resistive or semiconducting element 16' in the form of an elongated strip having an enlarged circular portion at its center. The resistive or semiconducting element 16' is overlaid with conductive bonding pads 18', 20' of generally rectangular configuration having thin inwardly extending arms contacting the cylindrical portion of the resistive or semiconducting element 16'. As a result of the circular configuration of the resistive or semiconducting element 16', heat from the element 16' is coupled to the temperature-sensing element 14 in a circular configuration. This circular "hot spot" is positioned above the optical fiber 30 that interrogates the temperature-sensing element 14 so that the temperature-dependent optical property of the temperature-sensing element 14 can be monitored at a remote location.

Figure 5:
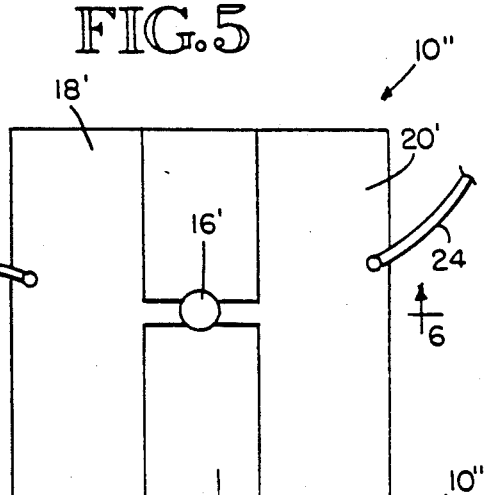
FIG. 5 is top plan view of still another embodiment of the inventive thermo-optical current sensor that provides compensation for ambient temperature shifts.
Figure 6:
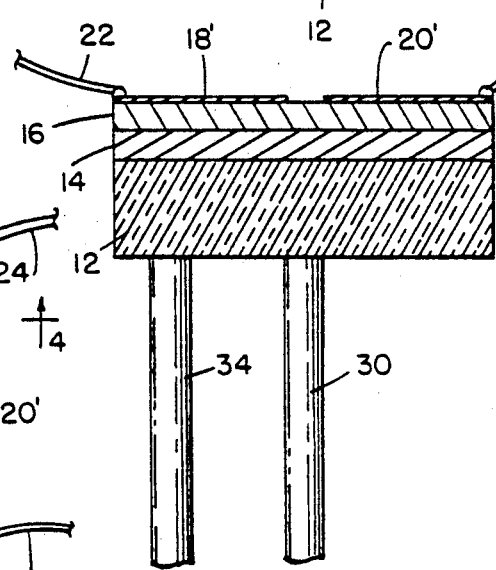
FIG. 6 is a cross-sectional view of the thermo-optical current sensor of FIG. 6 taken along the line 6—6 of FIG. 5.

Still another embodiment of the thermo-optical current sensor 10" is illustrated in FIGS. 5 and 6. Once again, for the sake of brevity, the components of the sensor 10" of FIGS. 5 and 6 that are identical to the components of the sensor 10' of FIGS. 3 and 4 have been given the same reference numerals. The sensor 10" of FIGS. 5 and 6 differs from the sensor 10' of FIGS. 3 and 4 by the addition of a second optical fiber 34 joining the transparent substrate 12 at a location that is offset from the portion of the resistive or semiconducting element 16' that is heated by the flow of the current to be measured. The use of a second optical fiber 34 to interrogate the temperature-sensing element 14 allows the current sensor 10" to be insensitive to variations in ambient temperature. In contrast, the embodiments of FIGS. 1-4 utilize a temperature-sensitive element 14 having an optical property that changes as a function of changes in ambient temperature as well as changes resulting from heating of the resistive or semiconducting element 16'. As a result, in environments in which the ambient temperature varies, it may not be possible to measure current with an acceptable degree of accuracy. The use of a second optical fiber 34 (FIGS. 5 and 6) to monitor the temperature-dependent optical property of the temperature-sensing element 14 at a location offset from the resistive or semi-conducting element 16' makes it possible to monitor changes in the optical property of the temperature-sensing element 14 resulting from changes in ambient temperature. The optical signal transmitted through optical fiber 34 indicative of ambient temperature can be compared to the optical signal transmitted through the optical fiber 30 indicative of both ambient temperature and current heating to determine the changes in the optical property of the temperature-sensing element 14 resulting solely from heating of the resistive or semiconducting element 16' by the current to be measured.

Although the embodiments of the current sensor illustrated in FIGS. 1-6 utilize optical fibers 30, 34 to monitor the temperature-dependent optical properties of the temperature-sensing element 14, it will be understood that the optical properties of the element 14 may be monitored utilizing other devices. For example, a suitable temperature-sensing element 14 may be used with an illuminating light and photodetector embedded in the substrate 12 adjacent the element 14, or coupled optically using conventional lenses and beamsplitters.

The optical temperature sensing element 14 may be a variety of sensing devices. For example, the temperature-sensing element 14 may be a sharp-cut filter glass temperature sensor having a spectral absorption edge that varies as a function of the temperature of the temperature-sensing element. A suitable sharp-cut filter glass temperature sensor is described in U.S. Pat. No. 4,307,607 to Saaski et al which is incorporated herein by reference. The optical temperature sensor may also be a conventional organic dye having a color that varies as a function of the temperature of the organic dye. Other candidates include fluorescent materials that change fluorescence with temperature and temperature sensors such as the sensor 40 illustrated in FIG. 7. Basically, a light source 42 generates input light which either may be monochromatic or it may be composed of a range of wavelengths falling within one or more color bands. A laser or light-emitting diode (LED) of conventional design may be used as the light source 42.

Input light from the light source 42 is coupled through a first optical fiber 44 to a first input port of a beam splitter 46 of conventional design. A second optical fiber 48 extends from a second port of the beam splitter 46. The beam splitter 46 couples light from the first optical fiber 44 at the first port of the beam splitter 46 into the second optical fiber 48 through the second port of the beam splitter 46. Light conveyed through the optical fiber 48 then reaches an optical temperature sensor 50, described in greater detail below. Basically, the optical temperature sensor 50 modifies the spectrum of input light incident on the optical temperature sensor 50 and reflects back output light constituting the input light that has been spectrally modulated. For example, the output light may be the input light having a decrease in amplitude at one wavelength with respect to another wavelength. The spectrally modulated output light reflected from the optical temperature sensor 50 is then coupled to the second port of the beam splitter 46 through optical fiber 48. Beam splitter 46 then couples the reflected output light to a third optical fiber 52. The reflected output light coupled through the optical fiber 52 is then sensed by a light detector 54 which may be, for example, a combination of conventional photodetectors and spectral splitters.

The optical temperature sensor 50 may be any device that is thermally actuated to shift or otherwise modulate the spectrum of the light incident on the temperature sensor 50 and reflect the light having the shifted or modulated spectrum back into the optical fiber 48. The temperature sensor 50 may be a Fabry-Perot interferometer having a transparent substrate 60 abutting the optical fiber 48. The substrate 60 is formed into a base having a planar surface 64 surrounded by sidewalls 68. The planar surface 64 is preferably circular, and the sidewall 68 is preferably cylindrical. A mirror 70 is bonded to the edge of the sidewall 68 to form a cavity 72. Alternately, the sidewall 68 may be integrally formed with the mirror 70, and the sidewall 68 may be bonded to the substrate 60. The inside surface 74 of the mirror 70 is preferably planar. Both surfaces 64 and 74 may incorporate evaporated thin films up to several hundred Angstroms thick to optimize spectral properties. The inner surface 74 of the mirror serves as an optical reflector forming a resonant cavity with the surface 64. The thickness of the cavity 72 (i.e., the distance between the inside surface 64 and the inside surface 74 of the mirror 70) is selected so that the input light coupled through optical fiber 48, resonates in the cavity 72. Cavity 72 thus forms an optical resonator. As is well understood in the art, the resonant properties of the cavity 72 are dependent upon the thickness of the cavity 72, as well as the index of refraction of material filling the cavity 72 and the reflecting properties of surfaces 64, 74.

The temperature sensor 50 may operate by utilizing a material in the cavity 72 having either a temperature-dependent index of refraction or a temperature-dependent thickness. In the latter case, the mirror 70 must have some resiliency so that it can expand as the material in the cavity 72 expands responsive to increases in temperature. The theory of operation of the Fabry-Perot interferometer is described in greater detail in U.S. Pat. No. 4,678,904 to Saaski et al., which is incorporated herein by reference.

Figure 7:
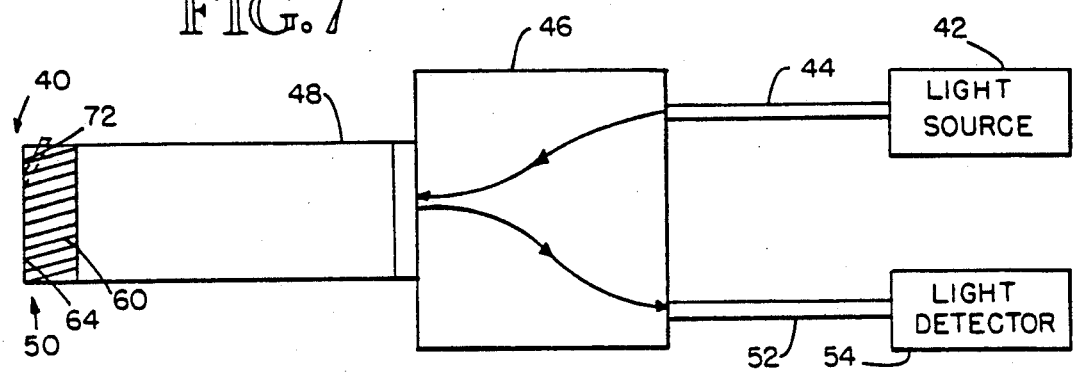
FIG. 7 is a cross-sectional view of a thermo-optical current sensor using an etalon-type temperature sensor.
Figure 8:
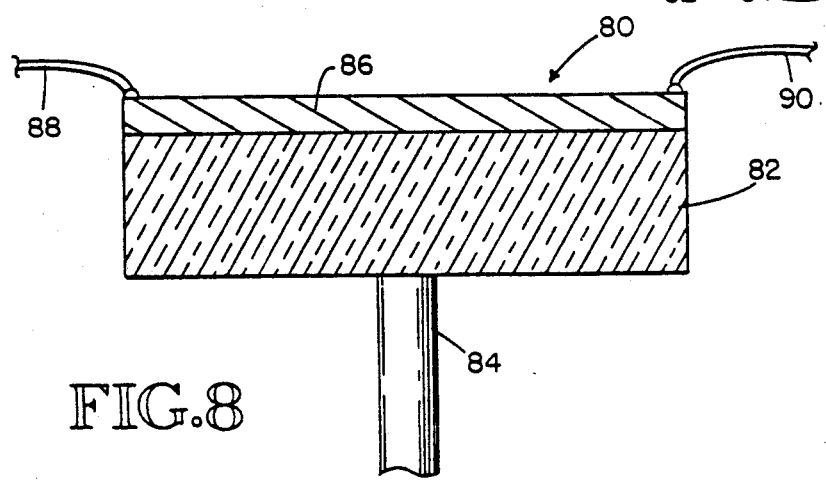
FIG. 8 is a cross-sectional view of a thermo-optical current sensor using an alternative etalon-type temperature sensor.

In the event that the Fabry-Perot interferometer of FIG. 7 is used as the temperature sensor in the current sensors of FIGS. 1-6, the outer surface of the mirror 70 would be covered with the resistive or semiconducting element 16 (FIGS. 1 and 2). However, the resistive or semiconducting element 16 and the optically resonant cavity 72 may be combined in a single structure in the embodiment illustrated in FIG. 8. The current sensor 80 illustrated in FIG. 8 utilizes a transparent substrate 82 having an optical fiber 84 extending therefrom. A layer 86 of transparent resistive or semiconducting material is placed over the substrate 82 and a pair of wires 88, 90 are bonded to spaced apart locations on the upper surface of the layer 86. Current flowing through the layer 86 between the wires 88, 90 causes an increase in temperature of the layer 86. As the temperature of the layer 86 increases, it physically expands and/or its refractive index changes so that its optical thickness undergoes a corresponding change in thickness, or the material's absorbance changes, affecting the resonator's optical properties. The thickness of the layer 86 is chosen so that it is optically resonant at the wavelengths of input light conveyed through the optical fiber 84. As the optical properties of the layer 86 vary in response to heating of the layer 86 by the current to be measured, the resonant properties of the layer 86 vary accordingly, in the same manner as in the temperature sensor 50 of FIG. 7.

One embodiment of the current sensor 10, 10' of FIGS. 1-4 utilized a 0.9 micron silicon interferometric sensing film as the sensing element 14. The sensing element 14 was bonded to a substrate 12 of Corning 7740 glass. The interferometric sensing film was overcoated with a multilayer film consisting of 1500 angstroms of titanium, 600 angstroms of gold, 500 angstroms of titanium and 4000 angstroms of silver. The overall pattern shown in FIG. 3 was then generated by etching, thereby leaving a multiple of layers having an I-beam configuration. As a final step, the silver layer was selectively removed from a small circular 150-micron area at the center to provide a microdot hot spot. Bond wires were then attached to each of the large pads. The sensor was then mounted on a pedestal containing a 100-micron core multimode optical fiber. The fiber was connected to an optical receiver of conventional design that could monitor the sensing film's temperature based on the spectral reflectance of the silicon film.

Figure 9:
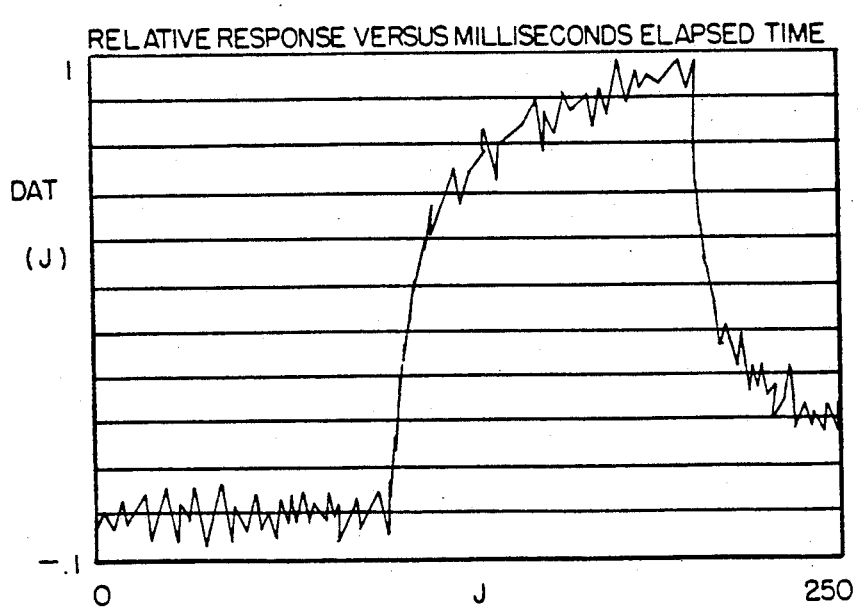
FIG. 9 is a graph of the response of the current sensor of FIG. 5 to a pulse of current in order to illustrate the response time of the current sensor.

In this embodiment, the gold film acted as the primary carrier of the electric current to be measured, i.e., the resistive or semiconducting element 16. The silver layer was used as, in effect, the bonding pads. The lower titanium layer served as a partial reflector for the interferometer, while the upper titanium layer protected the gold film Final sensor resistance was 2 ohms, and the dimension of the sensor was 1 millimeter square and 0.25 millimeter thick. The above-described current sensor has a very short response time. For a 1-micron thick film, thermo-equilibrium within the optically resonant layer requires about 30 nanoseconds. As illustrated in FIG. 9, a resistive or semiconducting element having a resistance of 2 ohm receiving a 100 milliamp pulse of 100 millisecond duration reaches equilibrium in about 100 milliseconds. The response time of the sensor 10 is a function of the thermal-diffusivity of the substrate 12 as well as the size and thermal-mass of the resistive or semiconducting element.

Figure 10:
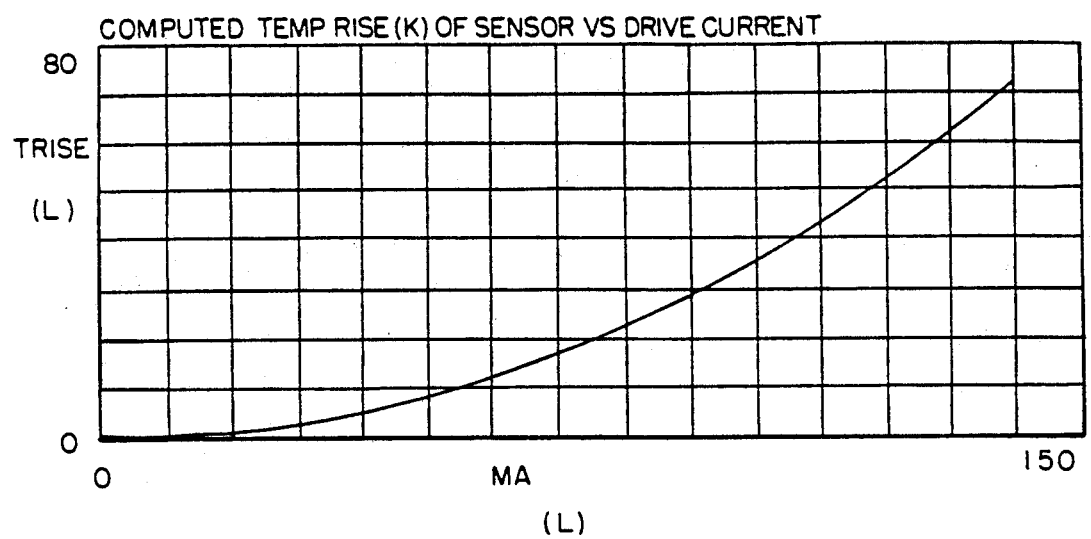
FIG. 10 is a graph of the temperature of the thermal element used in one embodiment of the inventive current sensor as a function of measured current.
Figure 11:
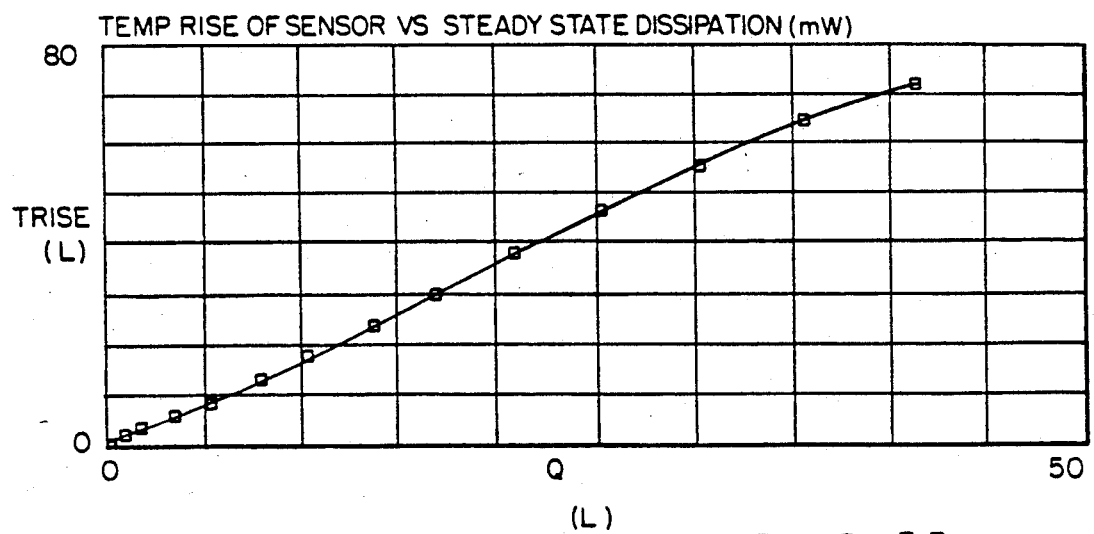
FIG. 11 is a graph of the temperature of the thermal element used in one embodiment of the inventive current sensor as a function of the heat dissipated in the thermal element.

The temperature rise of the resistive or semiconducting element in the above-described example versus measured current and milliwatts of power dissipated are illustrated in FIGS. 10 and 11, respectively. It will be noted that the temperature rise is near-linear with respect to the dissipated power.

Figure 12:
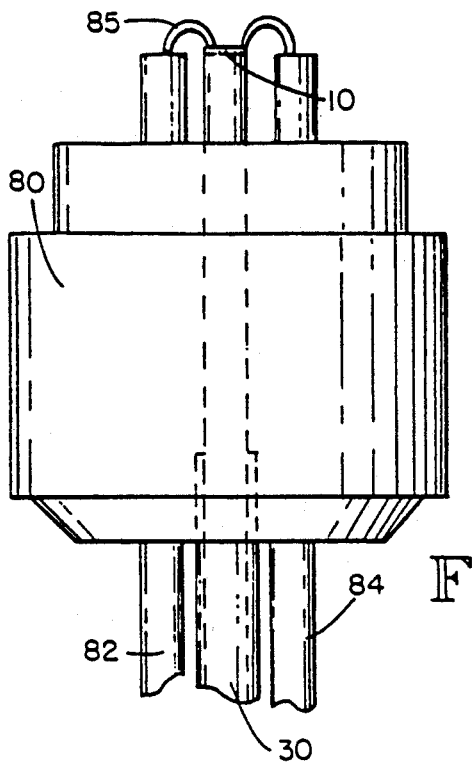
FIG. 12 is a plan view of an inventive current sensor mounted on a conventional detonator (EED) that can be used to perform tests to determine if there is a potential problem on a carrier deck or to warn the pilot of or prevent an inadvertent firing of the EED.
Figure 13:
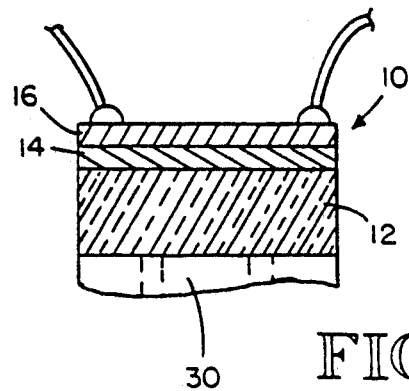
FIG. 13 is an exploded cross-sectional view of a portion of the current sensor used in the application of FIG. 12.
Figure 14:
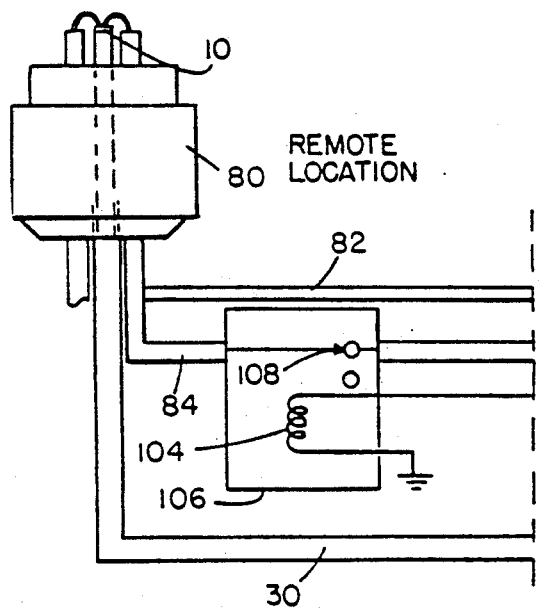
FIG. 14 a block diagram of a system using the inventive current sensor for warning a pilot of and preventing an inadvertent firing of an EED.
Figure 14:
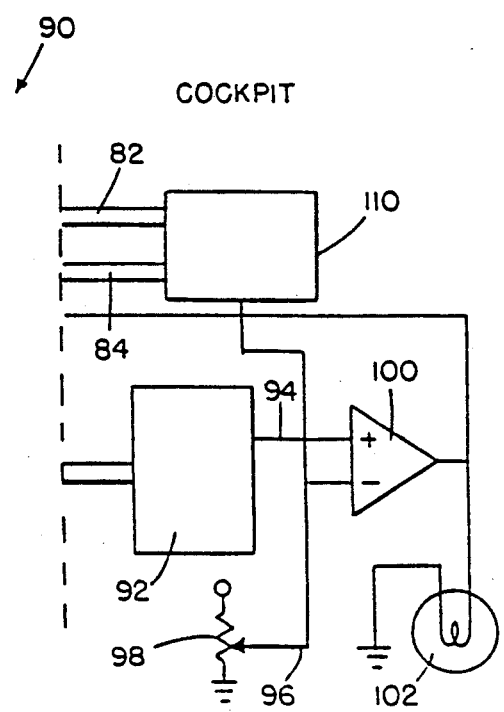

The inventive thermo-optical current sensor can advantageously be used in a high-electromagnetic field environment. Many aircraft and space vehicles use explosive bolts to disengage sections of the vehicle. The explosive bolts are fired by electro-explosive devices (EED's) that are initiated by detonators through small electrical wires. Spurious signals imparted to these devices through the electrical wires are becoming of increasing concern since the EED's can be inadvertently detonated by spurious signals generated by these strong electromagnetic fields. As best illustrated in FIGS. 12 and 13, the thermo-optical current sensor 10 of FIGS. 1 and 2 can be mounted on a conventional detonator 80 to monitor the magnitude of the spurious signals generated on conductors 82, 84 used for detonating the detonator. The current sensor 10 is connected to the conductors 82, 84 in either parallel or series with detonating wire 85 of the detonator 80. The combination of detonator 80 and thermo-optical current sensor 10, as illustrated in FIGS. 12 and 13, may be used in a system 90 for warning of and/or preventing inadvertent firing of the detonator 80. The optical fiber 30 extends from the current sensor 10 mounted on the detonator 80 to a conventional monitoring system 92, such as illustrated in FIG. 14, located at a distant location, such as in the aircraft's cockpit. The monitoring system 92 outputs a signal on line 94 that is indicative of the current flowing through the sensor 10. A reference signal is generated on line 96 by potentiometer 98. The signal on line 94 indicative of the current passing through the sensor 10 is compared to the reference signal on line 96 by a conventional comparator 100. When the current flowing through the sensor 10 into the detonator 80 exceeds a predetermined value corresponding to the reference signal, the output of the comparator 100 goes positive thereby illuminating a warning lamp 102 and causing current to flow through coil 104 of a normally closed relay 106. As a result, relay contact 108 opens to break the circuit through line 84 thereby preventing the inadvertent firing of the detonator 80.

When the pilot wishes to fire the detonator 80, a conventional fire control system 110 outputs an initiation signal on lines 82, 84. At the same time, the fire control system 110 places a large positive voltage on the negative input of comparator 100 to prevent the comparator 100 from responding to the initiating current and opening the relay 104. The system illustrated in FIG. 14 thus breaks the circuit through the detonator 80 resulting from spurious signals generated by stray electromagonetic fields but allows the detonator 80 to be fired by a conventional fire control system.

Figure 15:
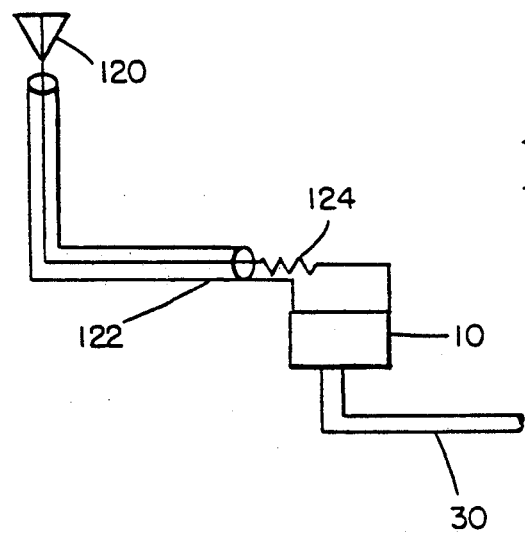
FIG. 15 is a schematic of an antenna field meter using the inventive current sensor.

Another application of the inventive current sensors 10 is illustrated in FIG. 15. In the embodiment of FIG. 15, the current sensor 10 is connected to a conventional antenna 120 by a coaxial cable 122. The center conductor of the coaxial cable 122 is connected to one lead of the current sensor 10 through an impedance matching resistor 124 while the outer conductor of the coaxial cable 122 is connected to the opposite terminal of the current sensor 10. The impedance matching resistor 124 can be eliminated by selecting the resistance of the resistive or semiconducting element 16 (FIGS. 1 and 2) to match the impedance of the coaxial cable 122. The current measured through optical fiber 30 is thus proportional to the intensity of the electro-magnetic field incident on antenna 120. In other cases, the cable 122 can be eliminated and the sensor mounted at the antenna output nodes.

Figure 16:
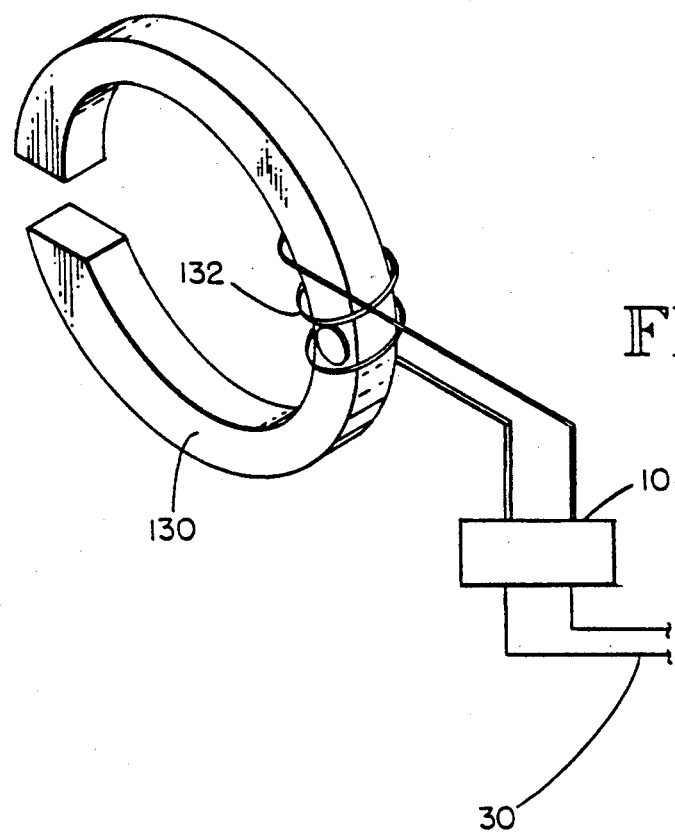
FIG. 16 is a schematic of a clamp-on current meter using the inventive current sensor that can be used to safely make current measurements on high voltage power lines.

The inventive current sensor 10 may also be used as a current meter, particularly for high-voltage power lines. A ferrite coil 130 having a pair of pivotally interconnected sections is adapted to extend around a high-voltage power line. A pickup coil 132 detects the magnetic field generated in the ferrite coil 130 indicative of the current flowing through the power line. The signal on the pickup coil 132 is connected to the current sensor 10. The current indicated by the optical signal in optical fiber 30 is thus indicative of the current flowing through a power line extending through the ferrite coil 130. An important advantage of the power meter of FIG. 16 is that the ferrite coil 130, transformer 134 and current sensor 10 can be electrically isolated from a monitoring system to which the optical fiber 30 is connected. As a result, an operator making current measurements can be relatively safe from electrical shock since the components illustrated in FIG. 16 can be located at one end of a boom or pole while a monitoring device may be located at the other end of the boom or pole with no electrical interconnection therebetween.

It is thus seen that the inventive thermo-optical current sensor can be used in a wide variety of applications to measure current under hostile conditions.

We claim:

1. A thermo-optical current sensor for measuring the current flowing between a pair of conductors, comprising:

an optical-sensing element having a resistive or semiconducting electrical property and an optical property that is a function of the temperature of said sensing element, said pair of conductors being connected between spaced apart locations on said sensing element so that the temperature of said optical-sensing element varies as a function of the current through said conductors and the temperature dependant optical property of said sensing element varies accordingly, the optical dependent property of said optical-sensing element varying over a range as a function of a temperature; and pickup means for monitoring the temperature dependent optical property of said an optical-sensing element at a stationary area of said sensing element, said pickup means including an optical fiber extending from said stationary area of said sensing element whereby the temperature dependent optical property monitored through pickup means is a function of the current through said conductors, and said pickup means monitor the spectral properties of the optical sensing element.

2. The thermo-optical current sensor of claim 1 wherein said optical-sensing element comprises:
an optical temperature sensor having an optical property that is a function of the temperature of said temperature sensor; and,
a resistive or semiconducting element mounted on and in thermal contact with said temperature sensor, said resistive or semiconducting element being connected between said pair of conductors so that the temperature dependent optical property of said optical temperature sensor varies as a function of the current through said wires.

3. The thermo-optical current sensor of claim 2 wherein said resistive or semiconducting element comprises a layer of resistive or semiconducting material mounted on said optical temperature sensor, said layer of resistive or semiconducting material having a pair of spaced apart bonding pads mounted on an exposed surface of said layer to which respective conductors are connected so that the current flowing through said conductors flows through said resistive or semiconducting material between said bonding pads.

4. The thermo-optical current sensor of claim 3 wherein said resistive or semiconducting material overlies the junction between said optical fiber and said optical-sensing element.

5. The thermo-optical current sensor of claim 4 further including a second optical fiber extending from said optical-sensing element, said second optical fiber joining said optical-sensing element at a location that is offset from said resistive or semiconducting material by a sufficient distance that heat generated by current flowing through said resistive or semiconductive material does not substantially affect the temperature dependent optical property of the portion of said optical-sensing element overlying said second optical fiber whereby said second optical fiber may be used to monitor changes in the temperature dependent optical property of said optical-sensing element that are due to changes in ambient temperature thereby allowing said current sensor to be insensitive to changes in ambient temperature.

6. The thermo-optical current sensor of claim 4 wherein said resistive or semiconducting material is in the form of a localized area to provide a hot spot responsive to current flowing through said resistive or semiconducting material, said circle being centered over the junction between said optical fiber and said optical-sensing element.

7. The thermo-optical current sensor of claim 2 wherein said optical temperature sensor is an optically resonant film or cavity filled with a sensing material that alters the resonance of said film or cavity as a function of the temperature of said sensing material so that input light having a wavelength spectrum directed through said optical fiber is reflected from said optically resonant film or cavity back into said optical fiber as output light having the wavelength spectrum of said input light modulated by the resonant properties of said film or cavity.

8. The thermo-optical current sensor of claim 7, further including a light source generating light having at least one wavelength on a resonant cycle of said optically resonant film or cavity, a light detector, and an optical system conveying light from said light source to said optical fiber and from said optical fiber to said light detector so that said light detector generates an electrical signal corresponding to the optical reflectivity of said film or cavity whereby the electrical output of said light detector varies as a function of the temperature of said sensing material.

9. The thermo-optical current sensor of claim 7 wherein said sensing material has an index of refraction that varies as a function of the temperature of said film or sensing material so that the spectral properties of said optically resonant film or cavity vary as a function of the temperature of said film or sensing material.

10. The thermo-optical current sensor of claim 7 wherein said optically resonant cavity is formed by an expandable enclosure, and wherein said sensing material has a coefficient of thermal expansion so that the thickness of said cavity varies as a function of the temperature of said sensing material so that the spectral properties of said optically resonant cavity vary as a function of the temperature of said sensing material.

11. The thermo-optical current sensor of claim 2 wherein said optical temperature sensor is a sharp-cut filter glass temperature sensor having a spectral absorption edge that varies as a function of the temperature of said temperature sensor so that input light directed through said optical fiber is reflected from said temperature sensor back into said optical fiber as output light having the amplitude of said input light attenuated or spectrally modified by the optical density of said temperature sensor.

12. The thermo-optical current sensor of claim 2 wherein said optical temperature sensor is an organic dye having a color that varies as a function of the temperature of said organic dye so that input light having a spectrum encompassing the color of said organic dye directed through said optical fiber is reflected from said organic dye back into said optical fiber as output light having the spectrum of said input light modulated by the color of said organic dye.

13. The thermo-optical current sensor of claim 1 wherein said optical-sensing element comprises a single layer of material having both a resistive or semiconducting electrical property and an optical property that is a function of the temperature of said sensing element, said pair of conductors being connected between spaced apart locations on said material.

14. The thermo-optical current sensor of claim 13 wherein said material is a thin layer of silicon.

15. The thermo-optical current sensor of claim 1 further including a detonator having a pair of leads through which an actuating signal is applied to said detonator, said current sensor being mounted on said detonator with the conductors that are connected to said sensing element being connected to the leads of said detonator thereby monitoring the current applied to said detonator.

16. The thermo-optical current sensor of claim 1 further including an antenna connected to said sensing element whereby said thermo-optical current sensor monitors the strength of an electromagnetic field picked up by said antenna.

17. The thermo-optical current sensor of claim 1 further including a ferrite coil that is adapted to surround a power line, said ferrite coil being coupled to said sensing element whereby said thermo-optical current sensor monitors the current passing through said power line.

18. A system for monitoring the current applied to a detonator through a pair of actuating leads on which spurious signals are picked up from the ambient electromagnetic signals, said system comprising:
an optical-sensing element having a resistive or semiconducting electrical property and an optical property that is a function of the temperature of said sensing element, said sensing element being connected to at least one of said actuating leads so that the current flowing through said sensing element is a function of the magnitude of said spurious signals whereby the temperature of said optical-sensing element varies as a function of the magnitude of said spurious signals and the temperature dependant optical property of said sensing element varies accordingly, the optical dependent property of said optical-sensing element varying over a range as a function of said temperature; and
an optical fiber extending from a stationary area of said optical sensing element for monitoring the temperature dependant optical property of said optical-sensing element whereby the temperature dependent optical property monitored through said optical fiber is a function of the magnitude of said spurious signals.

19. The system of claim 18 wherein said optical-sensing element comprises:
an optical temperature sensor having an optical property that is a function of the temperature of said temperature sensor; and,
a resistive or semiconducting element mounted on and in thermal contact with said temperature sensor, said resistive or semiconducting element being connected to at least one of said actuating leads so that the temperature dependent optical property of said optical temperature sensor varies as a function of the voltage or current applied to said detonator.

20. The system of claim 19 wherein said resistive or semiconducting element comprises a layer of resistive or semiconducting material mounted on said optical temperature sensor, said layer of resistive or semiconducting material having a pair of spaced apart bonding pads mounted on an exposed surface of said layer to which said actuating leads are connected so that the current flowing through said resistive or semiconducting material between said bonding pads is a function of the magnitude of said spurious signals.

21. The system of claim 19, wherein said optical temperature sensor is an optically resonant film or cavity filled with a sensing material that alters the resonance of said film or cavity as a function of the temperature of said film or sensing material so that input light having a wavelength spectrum directed through said optical fiber is reflected from said optically resonant film or cavity back into said optical fiber as output light having the wavelength spectrum of said input light modulated by the resonant properties of said film or cavity.

22. The system of claim 18 further including warning means for providing a warning in the event that the magnitude of said spurious signals exceed a predetermined value, said warning means including a detection system coupled to said optical fiber and generating a sense signal indicative of the magnitude of said spurious signals, and means receiving said sense signal for generating said warning in the event that said sense signal indicates that the magnitude of said spurious signals exceed said predetermined magnitude.

23. The system of claim 18 further including protection means for preventing the inadvertent actuation of said detonator, said protection means including a detection system coupled to said optical fiber and generating a sense signal indicative of the magnitude of said spurious signals, switch means for opening the circuit through said actuating leads and detonator in response to a disable signal, and means receiving said sense signal for generating said disable signal and applying said disable signal to said switch means in the event that the magnitude of said spurious signals exceed a predetermined magnitude.

* * * * *